(12) United States Patent
Jacobson et al.

(10) Patent No.: US 6,995,550 B2
(45) Date of Patent: Feb. 7, 2006

(54) METHOD AND APPARATUS FOR DETERMINING PROPERTIES OF AN ELECTROPHORETIC DISPLAY

(75) Inventors: Joseph M. Jacobson, Newton Centre, MA (US); Paul Drzaic, Lexington, MA (US); Steven J. O'Neil, Pembroke, MA (US); Holly G. Gates, Somerville, MA (US); Justin Abramson, Somerville, MA (US)

(73) Assignee: E Ink Corporation, Cambridge, MA (US)

( * ) Notice: Subject to any disclaimer, the term of this patent is extended or adjusted under 35 U.S.C. 154(b) by 31 days.

(21) Appl. No.: 10/649,370

(22) Filed: Aug. 27, 2003

(65) Prior Publication Data

US 2005/0099672 A1    May 12, 2005

Related U.S. Application Data

(63) Continuation of application No. 10/277,527, filed on Oct. 22, 2002, now abandoned, which is a continuation-in-part of application No. 09/349,808, filed on Jul. 8, 1999, now Pat. No. 6,512,354.

(60) Provisional application No. 60/092,046, filed on Jul. 8, 1998.

(51) Int. Cl.
*G01N 27/00* (2006.01)
*G01R 31/00* (2006.01)

(52) U.S. Cl. .................................. 324/71.1; 324/96
(58) Field of Classification Search ............. 324/71.1, 324/96; 359/296, 290; 204/606, 450
See application file for complete search history.

(56) References Cited

U.S. PATENT DOCUMENTS

| | | | |
|---|---|---|---|
| 3,585,381 A | 6/1971 | Hodson | 349/21 |
| 3,756,693 A | 9/1973 | Ota | 204/643 |
| 3,972,040 A | 7/1976 | Hilsum et al. | 340/324 M |
| 4,218,302 A | 8/1980 | Dalisa et al. | 359/296 |
| 4,789,858 A | 12/1988 | Fergason et al. | 340/784 |
| 5,174,882 A | 12/1992 | DiSanto et al. | 204/600 |
| 5,194,852 A | 3/1993 | More et al. | 340/712 |
| 5,627,561 A | 5/1997 | Laspina et al. | 359/296 |
| 5,930,026 A | 7/1999 | Jacobson et al. | 359/296 |
| 5,961,804 A | 10/1999 | Jacobson et al. | 204/606 |
| 6,017,584 A | 1/2000 | Albert et al. | 427/213.3 |

(Continued)

FOREIGN PATENT DOCUMENTS

JP    09016116 A    1/1997
JP    09185087 A    7/1997

OTHER PUBLICATIONS

XP-002102514 7.5/4:05 P.M.: A Stylus Writable Electrophoretic Display Device, Anne Chiang, Don Curry and Mark Zarzycki, Xerox Research Center, Palo Alto, CA, SID 79 Digest, pp. 44 and 45.

*Primary Examiner*—Jermele Hollington
(74) *Attorney, Agent, or Firm*—David J. Cole

(57) ABSTRACT

A method for sensing the state of an electrophoretic display includes the steps of applying an electrical signal to a display element, measuring an electrical response for the display element, and deducing the state of the display element from the measured electrical response. Also, the parameters of the display materials are determined using the encapsulated electrophoretic display media as a sensor, either alone or in conjunction with other sensors.

47 Claims, 10 Drawing Sheets

U.S. PATENT DOCUMENTS

| | | | | |
|---|---|---|---|---|
| 6,045,955 | A | 4/2000 | Vincent | 359/296 |
| 6,051,957 | A | 4/2000 | Klein | 324/427 |
| 6,067,185 | A | 5/2000 | Albert et al. | 204/606 |
| 6,118,426 | A | 9/2000 | Albert et al. | 324/96 |
| 6,120,588 | A | 9/2000 | Jacobson | 106/31.16 |
| 6,120,839 | A | 9/2000 | Comiskey et al. | 427/213.3 |
| 6,262,706 | B1 | 7/2001 | Albert et al. | 349/86 |
| 6,262,833 | B1 | 7/2001 | Loxley et al. | 204/606 |
| 6,300,932 | B1 * | 10/2001 | Albert | 345/107 |
| 6,392,786 | B1 * | 5/2002 | Albert | 359/296 |
| 6,445,489 | B1 * | 9/2002 | Jacobson et al. | 359/296 |
| 6,504,524 | B1 * | 1/2003 | Gates et al. | 345/107 |
| 6,512,354 | B2 * | 1/2003 | Jacobson et al. | 324/71.1 |
| 6,515,649 | B1 * | 2/2003 | Albert et al. | 345/107 |
| 6,518,949 | B2 * | 2/2003 | Drzaic | 345/107 |
| 6,531,997 | B1 * | 3/2003 | Gates et al. | 345/107 |
| 6,538,801 | B2 * | 3/2003 | Jacobson et al. | 359/296 |
| 6,671,081 | B2 * | 12/2003 | Kawai | 359/296 |
| 6,738,050 | B2 * | 5/2004 | Comiskey et al. | 345/107 |

\* cited by examiner

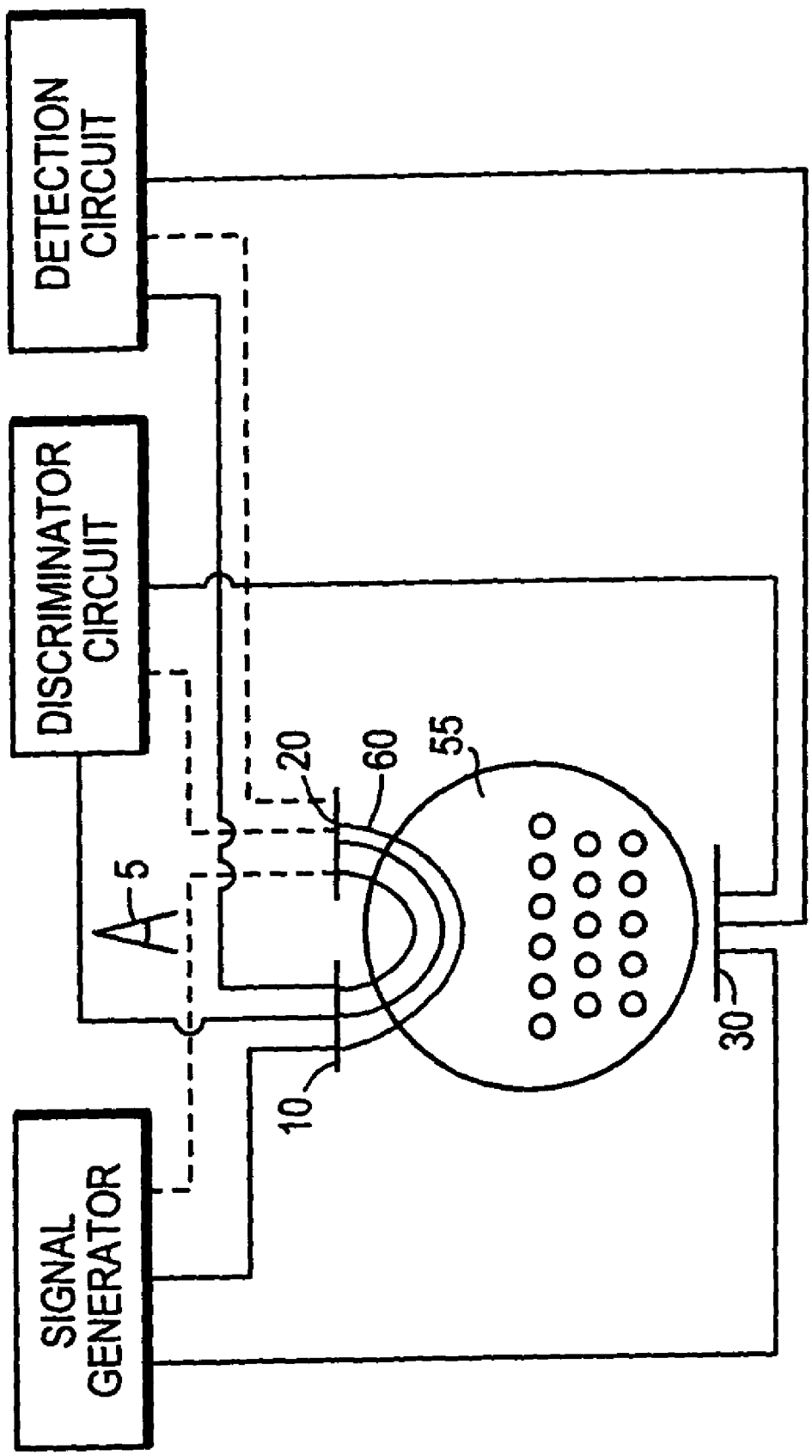

METHOD AND APPARATUS FOR DETERMINING PROPERTIES OF AN ELECTROPHORETIC DISPLAY

CROSS-REFERENCE TO RELATED APPLICATIONS

This application is a continuation of U.S. application Ser. No. 10/277,527, filed Oct. 22, 2002, now abandoned, which is continuation of and claims priority to U.S. Ser. No. 10/277,527 filed Oct. 22, 2002, which is a continuation-in-part of and claims priority to U.S. Ser. No. 09/349,808 filed Jul. 8, 1999, now U.S. Pat. No. 6,512,354, which claims priority to U.S. Ser. No. 60/092,046 filed Jul. 8, 1998, the entire disclosure of each application being incorporated by reference herein.

FIELD OF THE INVENTION

The present invention relates to electronic displays and, in particular, to methods and apparatus for determining properties of electrophoretic displays.

BACKGROUND OF THE INVENTION

Electrophoretic display media, generally characterized by the movement of particles through an applied electric field, are highly reflective, can be made bistable, can be scaled to a large area, and consume very little power. Encapsulated electrophoretic displays also enable the display to be printed. These properties allow encapsulated electrophoretic display media to be used in many applications for which traditional electronic displays are not suitable, such as flexible displays.

One particular application for displaying screens are input devices, such as touch screens or keypads, or writing tablets. In many cases, it is desirable to sense the state of the display in order to digitize the input. For example, measuring and analyzing certain properties of the display may enable detection of the location of the input. A responsive event or action may then be generated.

Also, the electrical properties of encapsulated electrophoretic display media may vary in response to environmental factors, such as temperature and humidity. In some circumstances, in order to achieve a repeatable optical state in the display, it may be desirable to compensate the drive waveform in response to changes in electrical properties of the polymeric materials that comprise encapsulated electrophoretic display media. Thus, it is desirable to measure the display parameters that affect waveform compensation scheme. Use of external display sensors, however, may increase cost of the display and complicate the manufacturing process. In addition, external sensors may not accurately measure the parameters inside the display.

SUMMARY OF THE INVENTION

An encapsulated electrophoretic display can be constructed so that the optical state of the display is stable for some length of time. When the display has two states, which are stable in this manner, the display is said to be bistable. If more than two states of the display are stable, then the display can be said to be multistable. For the purpose of this invention, the term bistable will be used to indicate a display in which any optical state remains fixed once the addressing voltage is removed. The definition of a bistable state depends on the application for the display. A slowly-decaying optical state can be effectively bistable if the optical state is substantially unchanged over the required viewing time. For example, in a display that is updated every few minutes, a display image that is stable for hours or days is effectively bistable for that application. In this invention, the term bistable also indicates a display with an optical state sufficiently long-lived as to be effectively bistable for the application in mind. Alternatively, it is possible to construct encapsulated electrophoretic displays in which the image decays quickly once the addressing voltage to the display is removed (i.e., the display is not bistable or multistable). As will be described, in some applications it is advantageous to use an encapsulated electrophoretic display that is not bistable. Whether or not an encapsulated electrophoretic display is bistable, and its degree of bistability, can be controlled through appropriate chemical modification of the electrophoretic particles, the suspending fluid, the capsule, and binder materials.

An encapsulated electrophoretic display may take many forms. The display may comprise capsules dispersed in a binder. The capsules may be of any size or shape. The capsules may, for example, be spherical and may have diameters in the millimeter range or the micron range, but is preferably from ten to a few hundred microns. The capsules may be formed by an encapsulation technique, as described below. Particles may be encapsulated in the capsules. The particles may be two or more different types of particles. The particles may be colored, luminescent, light-absorbing or transparent, for example. The particles may include neat pigments, dyed (laked) pigments or pigment/polymer composites, for example. The display may further comprise a suspending fluid in which the particles are dispersed.

The successful construction of an encapsulated electrophoretic display requires the proper interaction of several different types of materials and processes, such as a polymeric binder and, optionally, a capsule membrane. These materials must be chemically compatible with the electrophoretic particles and fluid, as well as with each other. The capsule materials may engage in useful surface interactions with the electrophoretic particles, or may act as a chemical or physical boundary between the fluid and the binder.

In some cases, the encapsulation step of the process is not necessary, and the electrophoretic fluid may be directly dispersed or emulsified into the binder (or a precursor to the binder materials) and an effective "polymer-dispersed electrophoretic display" constructed. In such displays, voids created in the binder may be referred to as capsules or microcapsules even though no capsule membrane is present. The binder dispersed electrophoretic display may be of the emulsion or phase separation type.

Throughout the specification, reference will be made to printing or printed. As used throughout the specification, printing is intended to include all forms of printing and coating, including: premetered coatings such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; and other similar techniques. A "printed element" refers to an element formed using any one of the above techniques.

The primary optical effect in a microencapsulated electrophoretic display device is the controlled positioning of one or more types of colloidal particles within a microcapsule. In one embodiment, colloidal particles are suspended in a colored fluid within the microcapsule. Application of an electrical signal will drive the particles to one side of the microcapsule or the other. If the colloidal particles are near the side of the microcapsule nearer the viewer, the viewer will see the color of the colloid. If the colloidal particles are nearer the opposite side of the microcapsule from the viewer, the viewer will see the colored fluid. The contrast between the colors of the fluid and the colloid, based on the colloid position, provides the means for a display device.

The position of the colloid can be controlled by application of electrical signals to electrodes built into the display. Additionally, it is possible to control the position of the colloid using an externally provided voltage signal (electrostatic writing). The display can be devised to work primarily by application of a field to electrodes, by electrostatic writing, or with both.

The present invention provides novel methods and apparatus for sensing the position of the colloid, that is, for sensing the state of electrophoretic displays electrically. The invention is also directed to novel methods and apparatus for determining the parameters of the display materials using the encapsulated electrophoretic display media as a sensor, either alone or in conjunction with other sensors.

In one aspect, the present invention relates to a method for determining properties of encapsulated electrophoretic display media, that includes providing encapsulated electrophoretic display media that has a plurality of capsules dispersed in a binder phase, wherein at least one of said plurality of capsules contains an electrophoretic contrast media phase that includes at least one particle and a suspending fluid. The method further includes providing two electrodes adjacent to said plurality of capsules; applying a first electrical signal to one of the electrodes, applying a second electrical signal to the other electrode; and measuring an electrical characteristic of the encapsulated electrophoretic display media that is generated in response to the applied first and second electrical signals.

In another aspect, the present invention relates to a method for determining properties of encapsulated electrophoretic display media that includes providing encapsulated electrophoretic display media that has a plurality of pixels, each pixel includes at least one capsule dispersed in a binder phase. The capsules contain an electrophoretic contrast media phase that includes at least one particle and a suspending fluid. The method further includes providing an electrode that is common and adjacent to each pixel of the plurality of pixels and providing at least one measurement pixel of the plurality of pixels that has a measurement electrode adjacent thereto. The method further includes applying a first electrical signal to the common electrode, applying a second electrical signal to the measurement electrode; and measuring an electrical characteristic of the measuring pixel that is generated in response to the applied electrical signals.

In still another aspect, the present invention relates to an apparatus for determining properties of encapsulated electrophoretic display media. The encapsulated electrophoretic display media includes a plurality of capsules dispersed in a binder phase and two electrodes adjacent to the plurality of capsules. At least one of said plurality of capsules contains an electrophoretic contrast media phase that includes at least one particle and a suspending fluid. The apparatus includes a signal generator for applying electrical signals to the two electrodes; and a detection circuit for measuring an electrical characteristic of the encapsulated electrophoretic display media generated in response to the applied electrical signals.

In yet another aspect, the invention relates to an electrophoretic display that includes encapsulated electrophoretic display media having a plurality of pixels. Each pixel includes at least one capsule dispersed in a binder phase. Each capsule contains an electrophoretic contrast media phase that includes at least one particle and a suspending fluid. The electrophoretic display of the invention, capable of determining properties of individual pixels, includes a first electrode that is common and adjacent to each of the plurality of pixels and at least one measurement pixel of the plurality of pixels, having a measurement electrode adjacent thereto. The display also includes a signal generator for applying electrical signals to these electrodes; and a detection circuit for measuring a first electrical characteristic of the measurement pixel that is generated in response to the applied electrical signals.

In still another aspect, the invention features an input device that includes an encapsulated electrophoretic display media having a plurality of pixels. Each pixel includes a pixel electrode adjacent thereto and at least one capsule dispersed in a binder phase. Each capsule contains an electrophoretic contrast media phase that includes at least one particle and a suspending fluid. The input device further includes a first electrode that is common and adjacent to each pixel of the plurality of pixels, a signal generator for applying electrical signals to the common electrode and each of the pixel electrodes, and a detection circuit for measuring an electrical characteristic of each of the plurality of pixels that is generated in response to the applied electrical signals. The input device also includes a discriminator circuit for detecting a change in the electrical characteristic of at least one pixel of the plurality of pixels; and a response generator for identifying the pixel with a change in the electrical characteristic and generating a response to the change.

BRIEF DESCRIPTION OF THE DRAWINGS

The invention is pointed out with particularity in the appended claims. The advantages of the invention described above, together with further advantages, may be better understood by referring to the following description taken in conjunction with the accompanying drawings. In the drawings, like reference characters generally refer to the same parts throughout the different views. Also, the drawings are not necessarily to scale, emphasis instead generally being placed upon illustrating the principles of the invention.

FIG. 1B is a diagrammatic side view of an electrophoretic display element with optical particles distant from the sensing electrodes.

DETAILED DESCRIPTION OF THE INVENTION

Figure 1A:
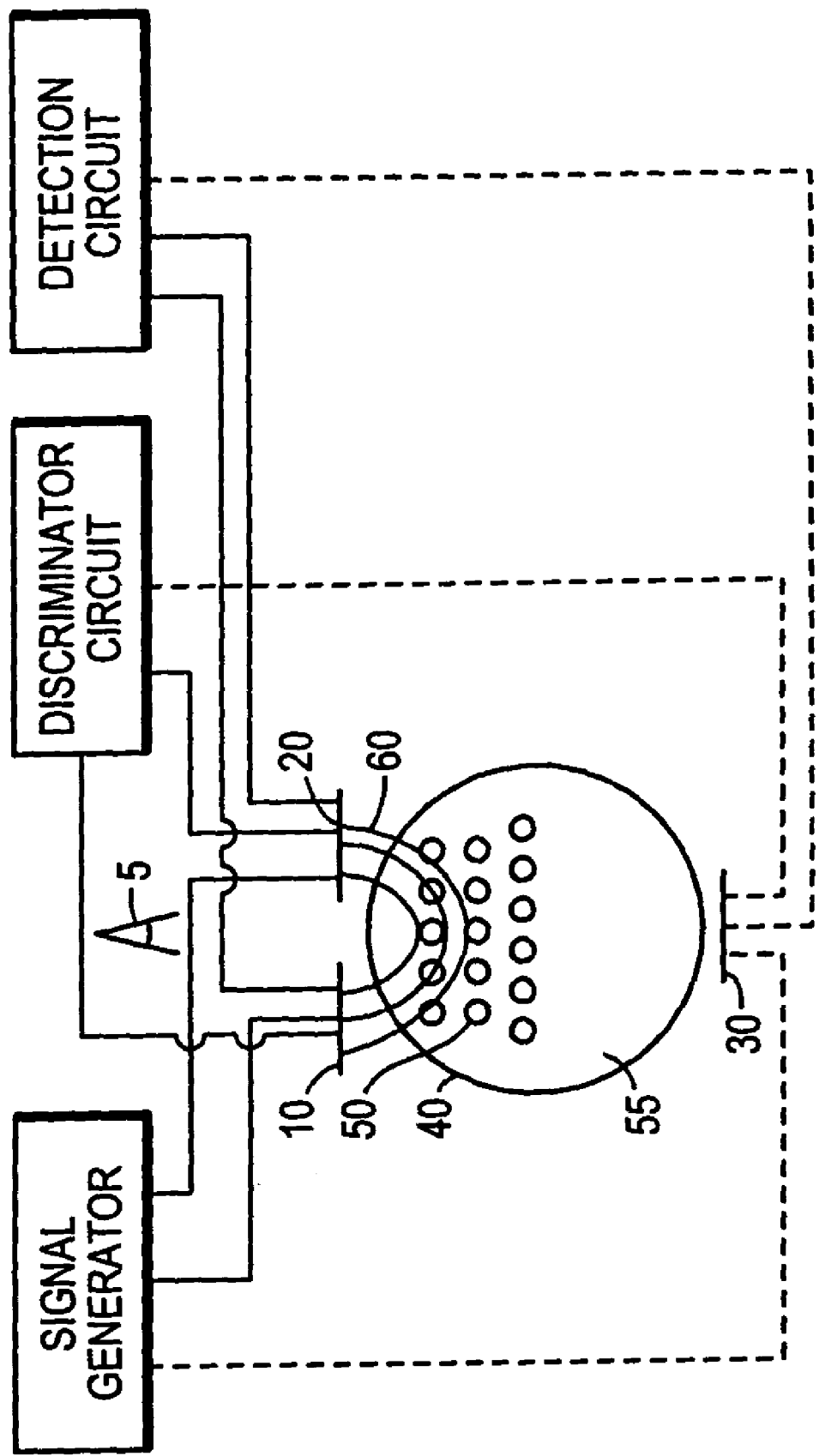
FIG. 1A is a diagrammatic side view of an electrophoretic display element with optical particles near the sensing electrodes.

An electronic ink is an optoelectronically active material which comprises at least two phases: an electrophoretic contrast media phase and a coating/binding phase. The electrophoretic phase comprises, in some embodiments, a single species of electrophoretic particles dispersed in a clear or dyed medium, or more than one species of electrophoretic particles having distinct physical and electrical characteristics dispersed in a clear or dyed medium. In some embodiments the electrophoretic phase is encapsulated, that is, there is a capsule wall phase between the two phases. The coating/binding phase includes, in one embodiment, a polymer matrix that surrounds the electrophoretic phase. In this embodiment, the polymer in the polymeric binder is capable of being dried, crosslinked, or otherwise cured as in traditional inks, and therefore a printing process can be used to deposit the electronic ink onto a substrate. An electronic ink is capable of being printed by several different processes, depending on the mechanical properties of the specific ink employed. For example, the fragility or viscosity of a particular ink may result in a different process selection. A very viscous ink would not be well-suited to deposition by an inkjet printing process, while a fragile ink might not be used in a knife over roll coating process.

The optical quality of an electronic ink is quite distinct from other electronic display materials. The most notable difference is that the electronic ink provides a high degree of both reflectance and contrast because it is pigment based (as are ordinary printing inks). The light scattered from the electronic ink comes from a very thin layer of pigment close to the top of the viewing surface. In this respect it resembles an ordinary, printed image. Also, electronic ink is easily viewed from a wide range of viewing angles in the same manner as a printed page, and such ink approximates a Lambertian contrast curve more closely than any other electronic display material. Since electronic ink can be printed, it can be included on the same surface with any other printed material, including traditional inks. Electronic ink can be made optically stable in all display configurations, that is, the ink can be set to a persistent optical state. Fabrication of a display by printing an electronic ink is particularly useful in low power applications because of this stability.

Electronic ink displays are novel in that they can be addressed by DC voltages and draw very little current. As such, the conductive leads and electrodes used to deliver the voltage to electronic ink displays can be of relatively high resistivity. The ability to use resistive conductors substantially widens the number and type of materials that can be used as conductors in electronic ink displays. In particular, the use of costly vacuum-sputtered indium tin oxide (ITO) conductors, a standard material in liquid crystal devices, is not required. Aside from cost savings, the replacement of ITO with other materials can provide benefits in appearance, processing capabilities (printed conductors), flexibility, and durability. Additionally, the printed electrodes are in contact only with a solid binder, not with a fluid layer (like liquid crystals). This means that some conductive materials, which would otherwise dissolve or be degraded by contact with liquid crystals, can be used in an electronic ink application. These include opaque metallic inks for the rear electrode (e.g., silver and graphite inks), as well as conductive transparent inks for either substrate. These conductive coatings include semiconducting colloids, examples of which are indium tin oxide and antimony-doped tin oxide. Organic conductors (polymeric conductors and molecular organic conductors) also may be used. Polymers include, but are not limited to, polyaniline and derivatives, polythiophene and derivatives, poly3,4-ethylenedioxythiophene (PEDOT) and derivatives, polypyrrole and derivatives, and polyphenylenevinylene (PPV) and derivatives. Organic molecular conductors include, but are not limited to, derivatives of naphthalene, phthalocyanine, and pentacene. Polymer layers can be made thinner and more transparent than with traditional displays because conductivity requirements are not as stringent.

As an example, there is a class of materials called electroconductive powders which are also useful as coatable transparent conductors in electronic ink displays. One example is Zelec ECP electroconductive powders from DuPont Chemical Co. of Wilmington, Del.

Referring now to FIGS. 1A and 1B, a highly diagrammatic view of an electrophoretic display element is shown. An electronic ink typically comprises many such elements in a binder phase. In brief overview, capsule 40 is provided and contains electrophoretic particles 50 suspended in a dispersing fluid 55. Dispersing fluid 55 may be clear or dyed. The particles 50 typically possess optical properties of interest, such as color, luminescence, or reflectance. In some embodiments, multiple species of particles 50 may be provided in the same capsule. Electrodes 10, 20, 30 are used to translate the particles 50 within the capsule 40, thus changing the appearance of the capsule 40 to a viewer 5. Electrodes 10, 20 may be used to apply a field 60 to the capsule 40 in order to sense its state.

The position of the particles 50 within the capsule 40 may be electrically determined by applying an electrical signal to electrodes 10, 20 and measuring the electrical properties of the capsule 40 in response to the applied electrical signal.

Figure 2:
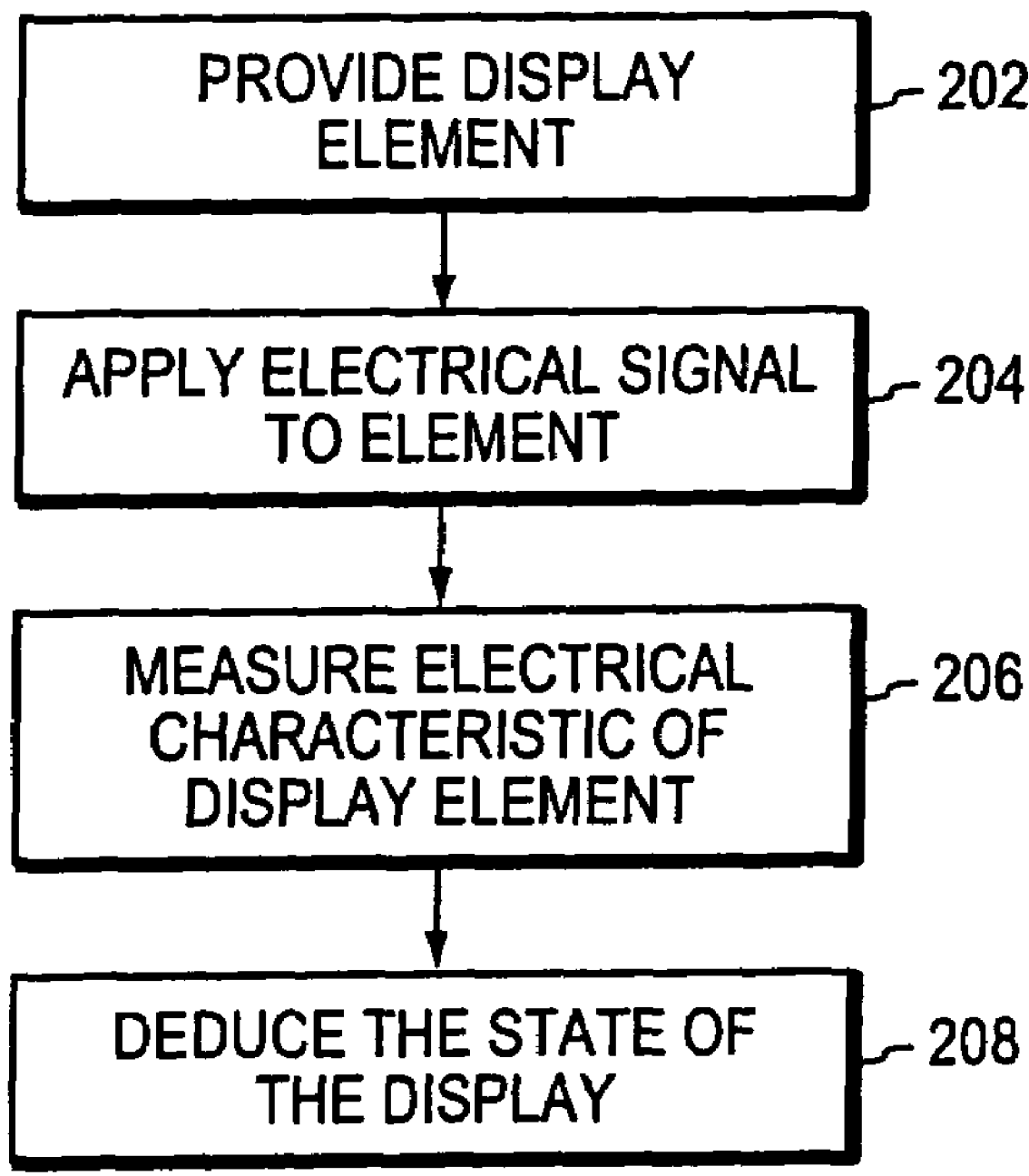
FIG. 2 is a flow chart showing the steps to be taken to sense the state of an electrophoretic display element.

In greater detail, the steps to be taken in sensing the state of an electrophoretic display are shown in FIG. 2. A display element to be measured is provided (step 202). In some embodiments, the display element is already attached to measurement device, i.e., the display includes circuitry for sensing the state of individual display elements. In other embodiments, the state of a display is measured by a separate device or devices.

An electrical signal is applied to the provided display element (step 204). Typically this is done via electrodes 10, 20, 30 adjacent the element. These can be the same electrodes used to translate the electrophoretic particles within the capsule or they can be a separate set of electrodes adjacent the capsule. The electrical signal applied to the capsule may be either an alternating-current (AC) field, a direct-current (DC) field, or some combination of the two.

Whether the signal applied to the capsule is AC, DC, or hybrid AC/DC, the signal is typically selected to minimize disturbance of the particles within the capsule. For example, an AC signal may be selected having a frequency less than 100 KHz, preferably less than 70 KHz, most preferably less than 10 KHz. In certain preferred embodiments, the selected AC signal has a frequency greater than 1 Hz. Further, voltages of such signals are selected to be less than 1 volt, preferably less than 500 millivolts, and most preferably less than 100 millivolts. In some preferred embodiments, the applied signal has an amplitude greater than 1 millivolt.

An internal or external signal source may be used to generate the electrical signal. For example, a preselected signal can be stored digitally in ROM or PROM that is electrically coupled to a digital-to-analog convertor and a driver that drives the signal to the electrodes. Alternatively, the display may be provided with an input jack, such as a BNA or similar jack, that allows a signal to be driven to the electrodes from an external signal generator.

If the electrical characteristic of particles 50 and dispersing fluid 55 differ, then the applied electrical signal will evoke a different electrical response from the display element depending on whether the particles 50 intersect the field 60 of the electrical signal applied to the electrodes or not.

The electrical response of the display element is measured (step 206). The electrical response measured can be capacitave, resistive, or some combination of two such as an RC time constant. The measurement circuit used can be a voltmeter, ammeter, ohmmeter, capacitance bridge, or some other circuit capable of measuring the desired electrical characteristic, such as a circuit capable of measuring frequency, time constant, or charge.

The state of the display element is deduced from the measured electrical response (step 208). For example, if the particles 50 have a much higher impedance than the dispersing fluid 55, then a voltage applied to the capsule 40 will be more attenuated if the particles 50 are nearer the electrodes than if they are not. In its simplest form, the circuit which performs this function (the "discriminator circuit") is a comparator. A measured electrical characteristic is compared to a predetermined threshold to determine if the particles 50 are near the electrodes or not. In another embodiment, AC current is passed through the display element at a particular frequency to determine a frequency response for the element.

The discriminator circuit may be analog or digital. In one embodiment, the discriminator circuit includes a processor that analyzes the measured electrical response of the display element. In a further embodiment, both the discriminator circuit and the signal generator are controlled by a processor.

EXAMPLE 1

A microencapsulated electrophoretic display comprising rutile titania dispersed in a low dielectric constant hydrocarbon fluid was provided. Two electrodes were positioned adjacent each other on the same substrate, adjacent also to a microcapsule, and on the back side of the display from the viewer. An AC electrical signal was placed across the electrodes, and the current passed between the electrodes measured. The frequency of the AC signal was set so that the capacitive characteristics of the microcapsules were measured. Typically, electrical frequencies in the range of 10 Hz to 10 KHz are useful in this regard. The dielectric constant near the electrodes depended on whether the colloid was on the same side of the microcapsule as the electrodes, or on the opposite sides. It is advantageous to have the spacing of the electrodes small compared to the microcapsule diameter. A high dielectric constant indicated that the colloidal particles were near the electrodes, and the display is dark. A low dielectric constant indicated that the colloidal particles were away from the electrodes and at the front of the microcapsule, and that the display is light. Low amplitude voltages were used to make the measurement. Preferably, the applied voltage is less than the operating voltage of the display. Typically, AC voltages in the range of 1 mV to 1 V, and particularly in the range of 10 mV to 100 mV, are useful.

EXAMPLE 2

A microencapsulated electrophoretic display was constructed with sensing electrodes on opposing sides of the display. These electrodes could be separate structures, or could be the same electrodes used to address the display. The colloidal dispersion was constructed so that the colloid contains a net negative charge. A negative charge is placed on the front electrode, sufficient to address some or all of the pixel. If the colloid is near the front of the microcapsule, the colloid will be repelled from the front surface and attracted to the back. The movement of the colloid gives a characteristic current signal, which rises, peaks, and then diminishes as the colloid transits the cell. This peak has a characteristic time constant and amplitude, depending on the display characteristics. For example, in a display which requires 90 V to address and a cell gap of 100 microns, the colloid transits in the range of 100 ms to 2 seconds, depending on the formulation.

Alternatively, if the colloid was already near the back, then application of this voltage will cause no change in the colloid position, and the electrical signal will be indicative of only background ions transiting the cell.

In this case, the discriminator circuit looks for the presence of absence of a peak with a constant in this range. If the colloid transits the cell, then the particles were near the front. If no peak is seen, the colloid was already near the back.

Alternatively, the detection circuit can be constructed to measure the total charged or current passed by the cell. The charge or current will be higher if the colloidal particles transit the cell, and be lower if they do not transit the cell.

EXAMPLE 3

The case of example 2, except the electrodes were adjacent as single side of the display, and spaced close together relative to the microcapsule size. Application of a voltage in the range of 1 V to 100 V causes some of the colloid to move from one electrode to the other if the colloid is near the surface of microcapsule adjacent the electrodes. If the colloid is on the other side of the microcapsule, no such transit will be seen. The discriminator circuit looks for the presence or absence of a current representing the colloidal particles, and thus determine if the colloid is on the face nearer or further from the electrodes. This method has the advantage of not disturbing the relative position of the colloid in the front or back of the display.

While the examples described here are listed using encapsulated electrophoretic displays, there are other particle-based display media which should also work as well, including encapsulated suspended particles and rotating ball displays.

In another embodiment, the invention is directed to methods and apparatus for determining the parameters of the display materials using the encapsulated electrophoretic display media as a sensor, either alone or in conjunction with other sensors.

Encapsulated electrophoretic display media is generally composed of polymeric materials, whose electrical properties, such as resistivity and capacitance, vary in response to environmental factors, such as temperature and humidity. In order to achieve a repeatable optical state in the display, it may be desirable to compensate the drive waveform in response to changes in electrical properties of the polymeric materials that comprise encapsulated electrophoretic display media. By enabling a waveform compensation scheme or increasing its effectiveness, the display quality and period of operation could be enhanced.

The correction of the drive waveform for humidity using the resistivity measurement is essentially empirical. Many encapsulated electrophoretic media, because they use hydrophilic wall materials such as gelatin, are sensitive to ambient humidity, depending on how well the medium is sealed. Also, as with most other materials, the resistivity of the encapsulated electrophoretic medium varies with its temperature. In a well-sealed medium, the water content of the display material is essentially unaffected by ambient humidity and the temperature dependence predominates. In one embodiment, the temperature is measured by a thermocouple or similar device embedded in the medium because measuring the internal temperature of the display is relatively simple using readily available industry-standard components, while the resistivity measurement is used to adjust the drive waveform for humidity, because measuring the humidity inside a display directly is complicated.

Figure 3:
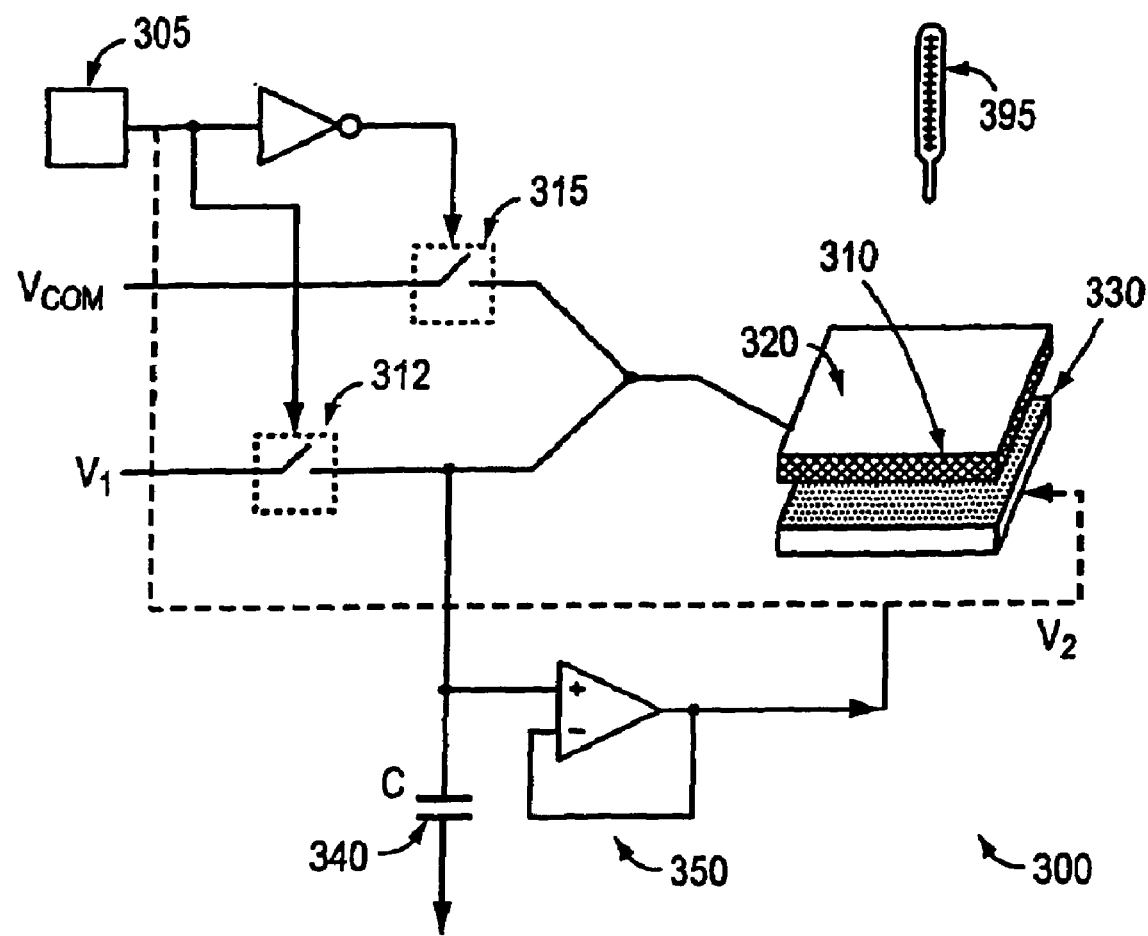
FIG. 3 shows a circuit diagram of an embodiment of the invention

Referring to FIG. 3, an encapsulated electrophoretic display 300 includes an encapsulated electrophoretic display media 310 having two electrodes, a common electrode 320 and a backplane electrode 330. In one embodiment, the resistivity of the encapsulated electrophoretic display media 310 is determined using the common electrode 320 of the electrophoretic display 300 as a sensor. In this embodiment, the resistivity is averaged over the entire area of the encapsulated electrophoretic display media 310.

Referring to FIG. 3, the common electrode 320 is connected to a detection circuit and a capacitor 340 having a known capacitance C. In the embodiment shown in FIG. 3, the detection circuit is a high-impedance voltage measurement circuit 350. Other circuits for detecting other electrical properties, such as a capacitance bridge or circuits capable of measuring time constants, frequency, or electrical charge can also be used.

Referring still to FIG 3, the common electrode 320 and the encapsulated electrophoretic display media 310 are driven to a voltage V1 by connecting the electrode 320 and media 310 to a voltage supply line maintained at this voltage via a switch 312 controlled by a signal generator 305. The electrical signal applied to the encapsulated electrophoretic display media 310 through the common electrode 320 may be either an alternating-current (AC) field, a direct-current (DC) field, or some combination of the two. Then, the common electrode 320 is disconnected from the voltage V1 by the signal generator 305 opening the switch 312 and is connected to an auxiliary circuit, for example, an analog switch 315 controlled by the signal generator 305. Then, the encapsulated electrophoretic display media 310 and the back electrode 330 are driven to a voltage V2. The potential difference (V2–V1) is measured by the high-impedance voltage measurement circuit 350.

Figure 4A:
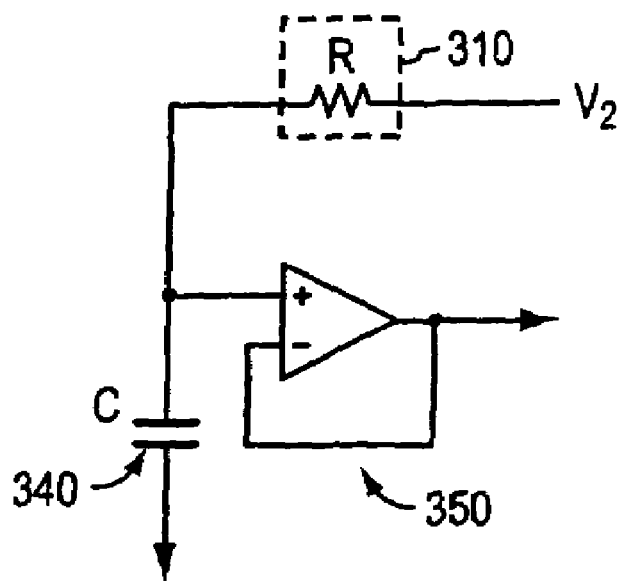
FIG. 4A shows a circuit diagram of the embodiment of FIG. 3 in a measurement mode.
Figure 4B:
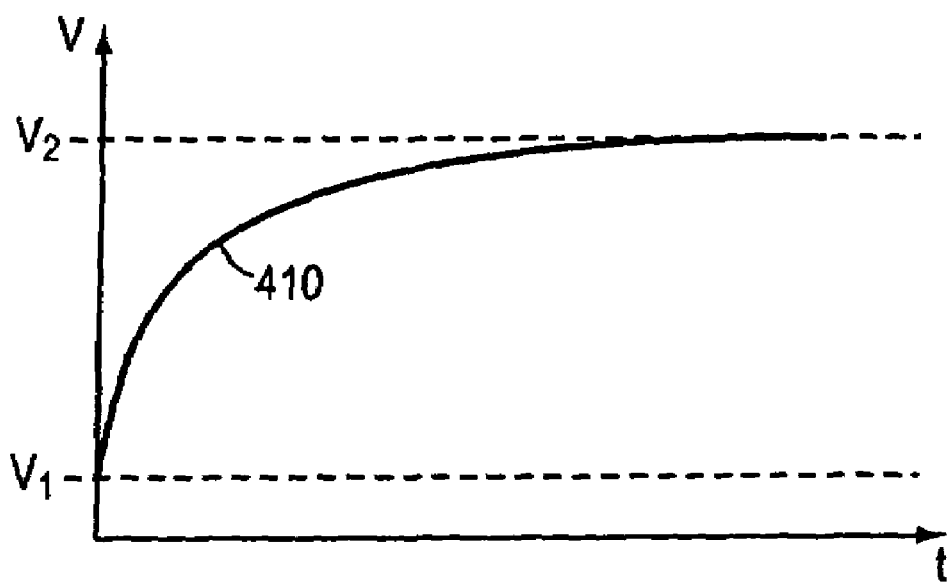
FIG. 4B is a graph showing exponential change of the voltage applied to the common electrode over the period of time in the embodiment of FIG. 3.

Referring to FIGS. 3 and 4A–4B, before the voltage V2 was applied, the capacitor 340 had a voltage V1. In the measurement mode, after the encapsulated electrophoretic display media 310 and the back electrode 330 are driven to the voltage V2, the voltage waveform V that appears at the common electrode 320 over a period of time would follow an exponential 410 with time constant RC, where R is the equivalent resistivity of all microcapsules of the encapsulated electrophoretic display media 310, and C is a known capacitance of the capacitor 340. The corresponding formula that reflects a relationship between V and V2–V1 as a function of time t is:

$$V=(V2-V1)(1-e^{(-t/RC)}) \quad (1)$$

where t is the lapsed time that the circuit voltage is changing, and e is the base of natural logarithms, which is a constant that equals about 2.7183. Thus, the equivalent resistivity R of the encapsulated electrophoretic display media 310 may be deduced using formula (1).

Figure 5:
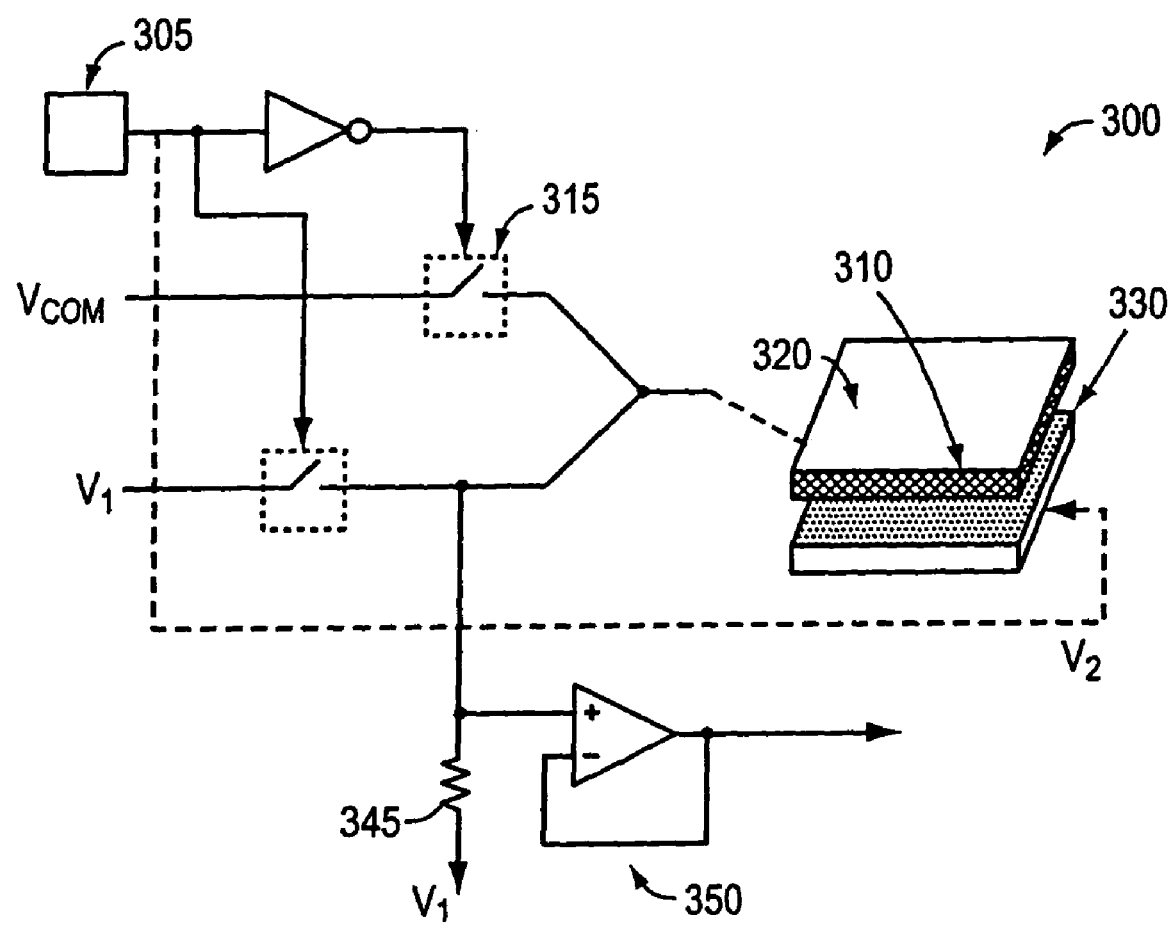
FIG. 5 shows a circuit diagram of an another embodiment of the invention

Referring to FIG. 5, in another embodiment, the common electrode 320 is connected to a detection circuit and a resistor 345 having a known resistance R2. In one embodiment, the detection circuit is a high-impedance voltage measurement circuit 350. In this embodiment, in the measurement mode, the common electrode 320 is driven to the voltage V1 through the resistor 345, while the encapsulated electrophoretic display media 310 and the back electrode 330 are driven to the voltage V2. The formula that reflects a relationship between the voltage waveform V that appears at the common electrode 320 and the equivalent resistivity of all microcapsules of the encapsulated electrophoretic display media 310 is:

$$V=(V2-V1)*R2/(R+R2) \quad (2)$$

Thus, the equivalent resistivity R of the encapsulated electrophoretic display media 310 may be deduced using formula (2). The amount of time necessary to take the measurement in this embodiment of the invention is relatively short, e.g. on the order of milliseconds, which could minimize the effect of undesirable transient voltages applied to the encapsulated electrophoretic display media 310.

Figure 6:
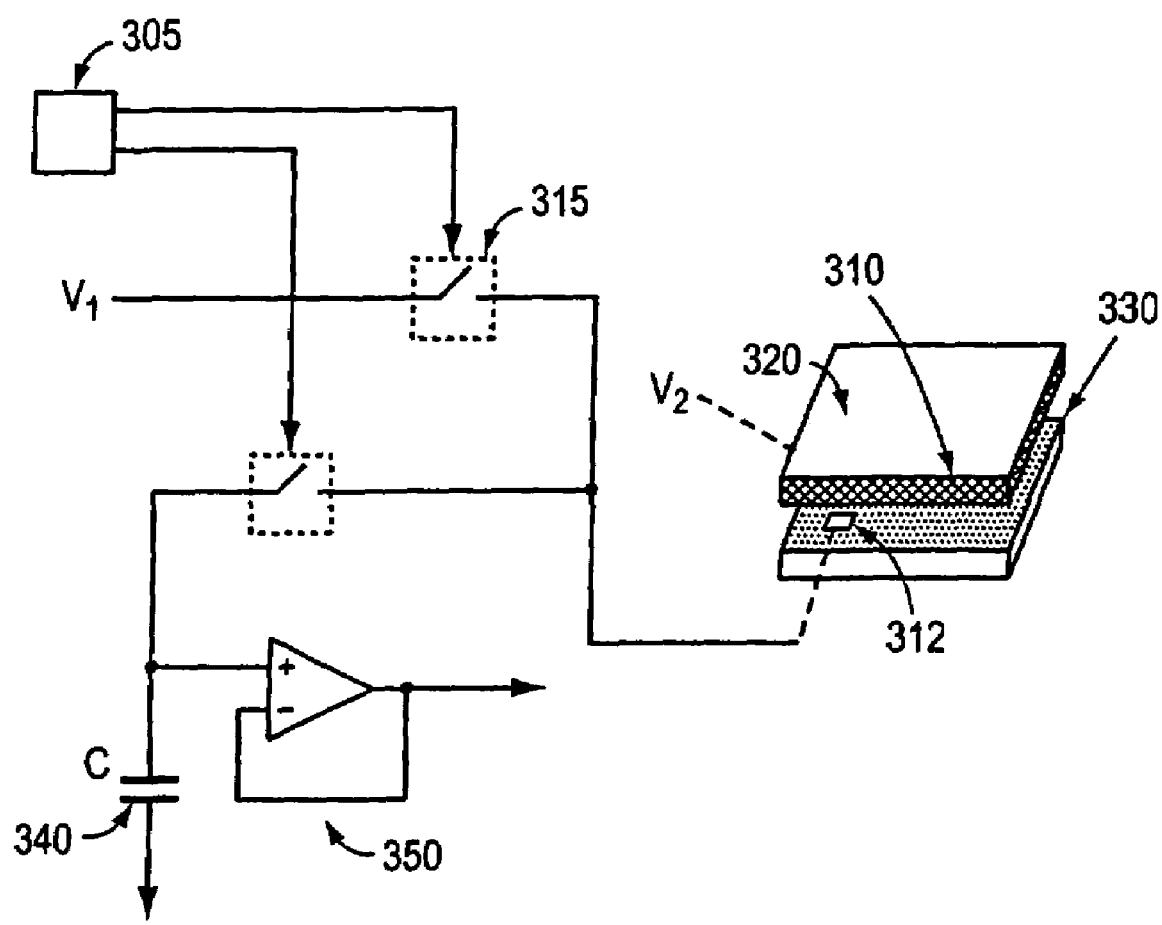
FIG. 6 shows a circuit diagram of yet another embodiment of the invention

Referring to FIG. 6, in another embodiment, the resistivity of the encapsulated electrophoretic display media 310 is determined using one or more of individual encapsulated electrophoretic display media elements 312 as sensors. In this embodiment, the resistivity of different parts of the electrophoretic display media 310 can be measured. Also, the resistivity of the entire electrophoretic display media 310 may be approximated by calculating an average between the measurements taken from individual encapsulated electrophoretic display media elements 312. In one version of this embodiment, each sensor 312 is one of the active electrophoretic display pixels, which is connected to the measurement circuit 350 when the electrophoretic display 300 is not in an update state. Alternatively, in another version of this embodiment, designated individual encapsulated electrophoretic display media elements that lie outside the active pixel area could be used for the resistivity measurement, if transient currents or the size of an active pixel make use of the active pixel as a sensor undesirable.

Referring still to FIG. 6, the sensing individual encapsulated electrophoretic display media element 312 is connected to a detection circuit and a capacitor 340 having a known capacitance C. In one embodiment, the detection circuit is a high-impedance voltage measurement circuit 350. Other circuits for detecting other electrical properties, such as a capacitance bridge or circuits capable of measuring time constants, frequency, or electrical charge can also be used.

The common electrode 320 and the encapsulated electrophoretic display media 310 are driven to a voltage V3 by a signal generator 305. The electrical signal applied to the encapsulated electrophoretic display media 310 through the common electrode 320 may be either an alternating-current (AC) field, a direct-current (DC) field, or some combination of the two. Then, the sensor 312 is driven to a voltage V4. The potential difference (V4–V3) at the sensor 312 is measured by the high-impedance voltage measurement circuit 350. As discussed above with respect to the embodiment of FIG. 3, the formula that reflects a relationship between the sensor voltage and V4–V3 as a function of time t is $$V=(V4-V3)(1-e^{(-t/RC)}) \quad (3)$$

where t is the lapsed time that the circuit voltage is changing, and e is the base of natural logarithms, which is a constant that equals about 2.7183. Thus, the resistivity R of the sensor element 312 may be deduced using formula (3).

Figure 7:
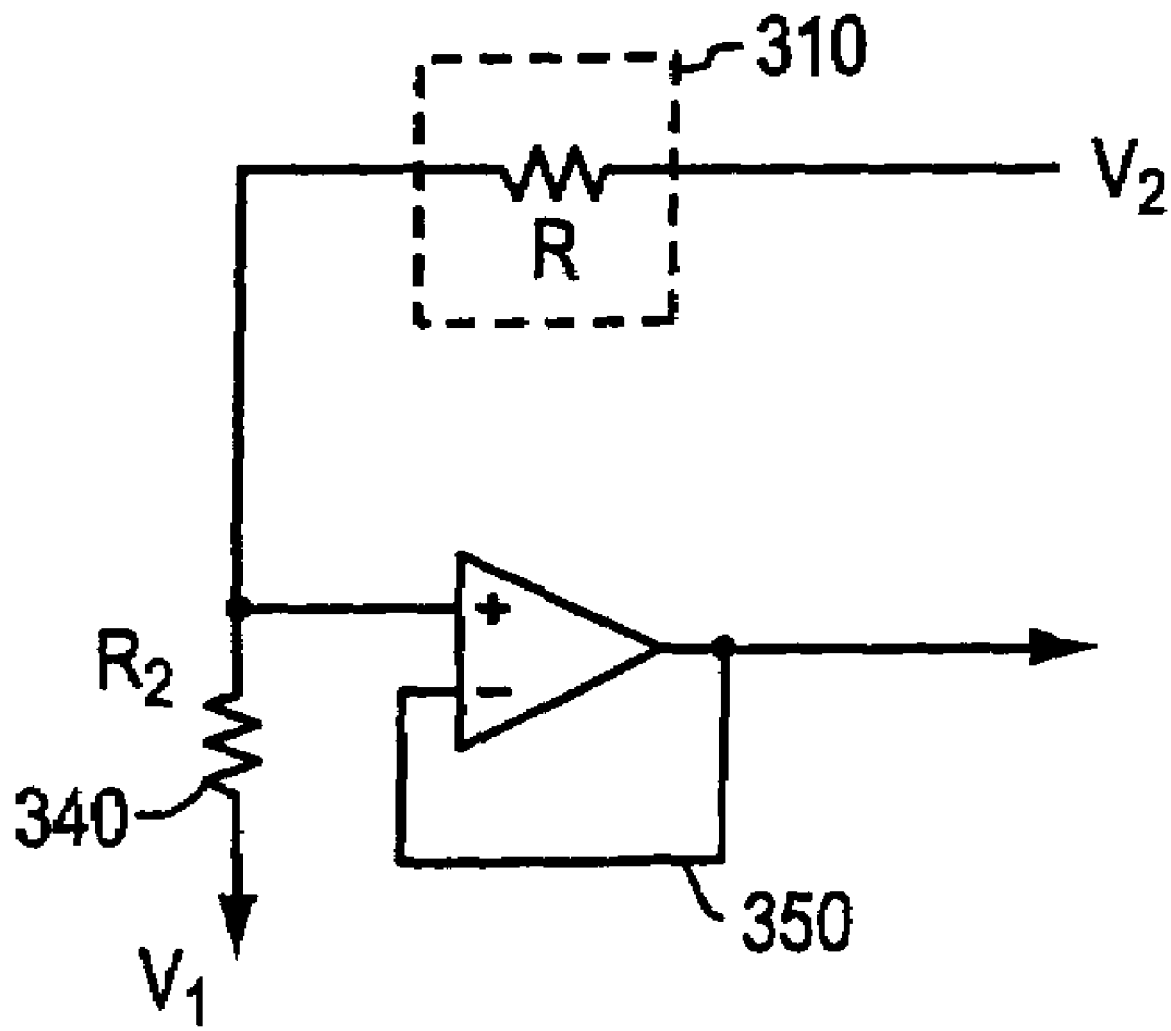
FIG. 7 is a diagrammatic view of an input device according to the invention.

Referring to FIG. 7, in another embodiment, the sensing element 312 is connected to a detection circuit and a resistor 345 having a known resistance R2. In one embodiment, the detection circuit is a high-impedance voltage measurement circuit 350. In this embodiment, in the measurement mode, the sensing element 312 is driven to the voltage V4 through the resistor 345, while the encapsulated electrophoretic display media 310 and the common electrode 320 are driven to the voltage V3. As discussed above, the formula that reflects a relationship between the voltage waveform V that appears at the sensing element 312 and its resistivity is:

$$V=(V4-V3)R2/(R+R2) \quad (4)$$

Thus, the resistivity R of each sensing element 312 of the encapsulated electrophoretic display media 310 may be deduced using formula (4).

After the resistivity of the encapsulated electrophoretic display media has been measured, its ambient humidity can then be deduced based on the resisitivity value. As mentioned above, many encapsulated electrophoretic media, because they use hydrophilic wall materials such as gelatin, are sensitive to ambient humidity, depending on how well the medium is sealed. The correlation between the resistivity of the display and the ambient humidity therein is essentially empirical.

Other environmental factors of the encapsulated electrophoretic display media, such as, for example, an ambient temperature, can be determined based on the resistivity value as well. Because the internal temperature of the display usually tracks the external temperature rather rapidly, with a lag time of a few minutes, in one embodiment of the invention, the ambient temperature is measured using an external sensor 395, as shown in FIG. 3. In another embodiment, the internal temperature is measured using a thermocouple embedded in a display. Other environmental factors of the encapsulated electrophoretic display media, can be determined using an external sensors as well.

Figure 8:
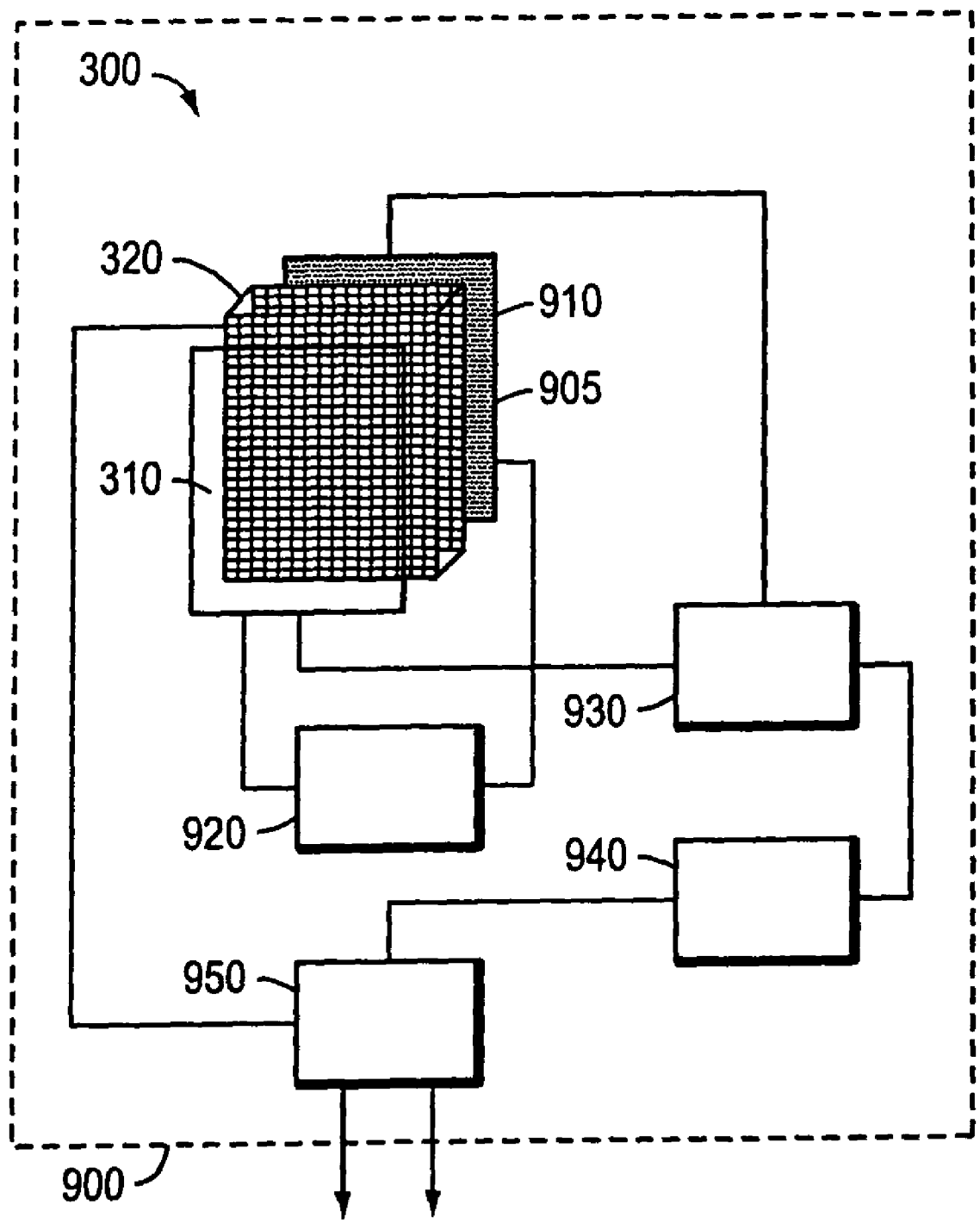
FIG. 8 is a flow chart of the operation of the input device according to the embodiment of FIG. 7

Referring to FIG. 8, in one embodiment, the encapsulated electrophoretic display 300, whose parameters can be determined using the encapsulated electrophoretic display media itself as a sensor is used as part of an input device 900, for example, a touch-screen display or a keypad. The input device 900 includes an encapsulated electrophoretic display media 310 and a common electrode 320. The common electrode 320 is formed from a conductive material capable of elastic deformation, such as indium tin oxide. Conductive polymers, such as polythiophene or polyaniline, can also be used. The encapsulated electrophoretic display media 310 includes a plurality of pixels 905, each of which includes at least one individual encapsulated electrophoretic display media element 312. Each pixel has a pixel electrode 910 adjacent thereto.

Referring still to FIG. 8, the input device 900 also includes a signal generator 920 for applying electrical signals to the common electrode 320 and each of pixel electrodes 910. The electrical signal applied to the encapsulated electrophoretic display media 310 by the common electrode 320 and each of pixel electrodes 910 may be either an alternating-current (AC) field, a direct-current (DC) field, or some combination of the two. A detection circuit 930, such as one described above in connection with the embodiments illustrated in FIG. 6, is provided for periodically measuring an electrical characteristic of each of said plurality of pixels, generated in response to the applied electrical signal.

Referring still to FIG. 8, the input device 900 also includes a discriminator circuit 940 for detecting a change in the electrical characteristic of at least one pixel of the plurality of pixels. In its simplest form, the circuit which performs this function (the "discriminator circuit") is a comparator. A measured electrical characteristic is compared to a previously measured value of this characteristic to detect a variation. The input device 900 also includes a response generator 950 in electrical communication with the discriminator circuit that is capable of identifying the pixel, whose electrical characteristic has changed since the previous measurement, and generating a response to this change. The discriminator circuit may be analog or digital. In one embodiment, the discriminator circuit includes a processor that analyzes the measured electrical response of the display element. In a further embodiment, the detection circuit, discriminator circuit, the response generator, and the signal generator are controlled by a processor.

Figure 9:
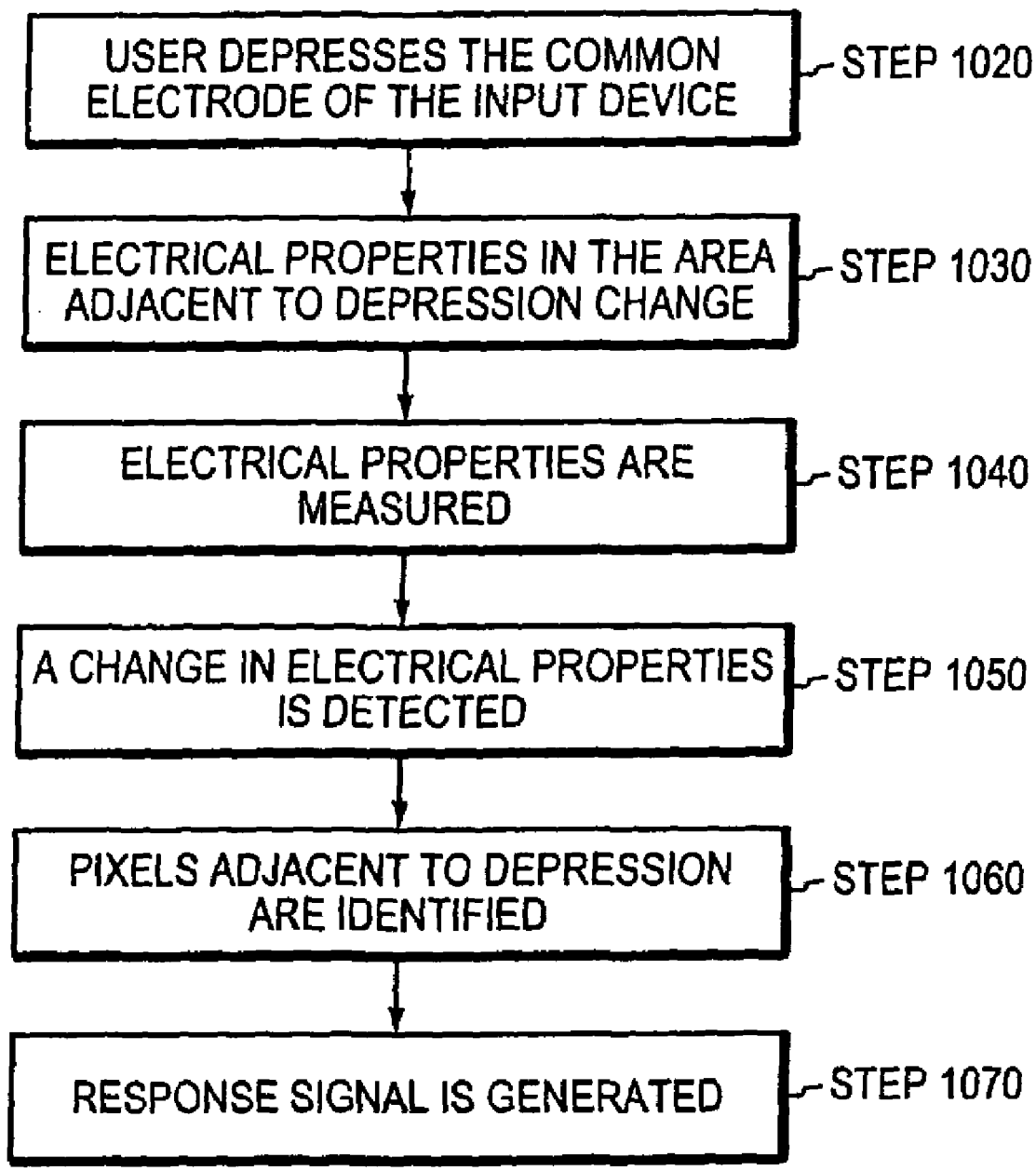
FIG. 9 is a flow chart showing the steps to be taken to sense the state of an electrophoretic display element.

Referring to FIG. 9, in operation, the detection circuit 930 periodically measures the electrical properties of each of the pixels of encapsulated electrophoretic display media 310. When a user depresses a part of the common electrode 320 of the encapsulated electrophoretic display 300 (STEP 1020), certain electrical properties of the encapsulated electrophoretic display media 310 in the area adjacent to the depression in the common electrode 320, such as, for example, voltage, resistivity, or capacitance, change (STEP 1030). The detection circuit 930 takes new measurements of the electrical properties (STEP 1040). The discriminating circuit 940 compares the new measurements with previously obtained measurements and detects a change in electrical properties of the pixels adjacent to the depression in the common electrode 320 (STEP 1050). The response generator 950 identifies one or more pixels whose electrical properties have changed and generates a response (STEP 1060). For example, the response generator may generate an output signal to be used by devices receiving input from the input device 900. While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. A method for determining properties of an encapsulated electrophoretic display medium, comprising the steps of:
   (a) providing an encapsulated electrophoretic display medium comprising a plurality of voids dispersed in a polymeric matrix, wherein at least one of said plurality of voids contains an electrophoretic contrast medium phase that includes at least one particle and a suspending fluid;
   (b) providing a first electrode and a second electrode, said first and second electrodes lying adjacent said plurality of voids;
   (c) applying a first electrical signal to said first electrode;
   (d) applying a second electrical signal to said second electrode; and
   (e) measuring a first electrical characteristic of said encapsulated electrophoretic display medium, said first electrical characteristic generated in response to said applied first and second electrical signals.

2. The method of claim 1, wherein step (e) comprises measuring a first electrical characteristic represented by a time constant.

3. The method of claim 1, wherein step (e) comprises measuring a first electrical characteristic represented by a current.

4. The method of claim 1, wherein step (e) comprises measuring a first electrical characteristic represented by a voltage.

5. The method of claim 1, wherein step (e) comprises measuring a first electrical characteristic represented by a capacitance.

6. The method of claim 1 further comprising deducing a second electrical characteristic of said encapsulated electrophoretic display medium based on said measured first electrical characteristic.

7. The method of claim 6 wherein said second electrical characteristic is resistivity of said encapsulated electrophoretic display medium.

8. The method of claim 7 further comprising measuring a first environmental factor of said encapsulated electrophoretic display medium using an external sensor.

9. The method of claim 8 further comprising determining a second environmental factor of said encapsulated electrophoretic display medium based on said resistivity and said measured first environmental factor.

10. The method of claim 9 wherein one of said first and second environmental factors is temperature and the other is humidity.

11. A method for determining properties of an encapsulated electrophoretic display medium, comprising the steps of:
(a) providing an encapsulated electrophoretic display medium comprising a plurality of pixels, each pixel comprising at least one void dispersed in a polymeric matrix, wherein said at least one void contains an electrophoretic contrast medium phase that includes at least one particle and a suspending fluid;
(b) providing a first electrode, said first electrode common to and adjacent each of said plurality of pixels;
(c) providing at least one measurement pixel of said plurality of pixels, said at least one measurement pixel having a measurement electrode adjacent thereto;
(d) applying a first electrical signal to said first electrode;
(e) applying a second electrical signal to said measurement electrode; and
(f) measuring a first electrical characteristic of said at least one measuring pixel, said first electrical characteristic generated in response to said applied first and second electrical signals.

12. The method of claim 11, wherein step (f) comprises measuring a first electrical characteristic represented by a time constant.

13. The method of claim 11, wherein step (f) comprises measuring a first electrical characteristic represented by a current.

14. The method of claim 11, wherein step (f) comprises measuring a first electrical characteristic represented by a voltage.

15. The method of claim 11, wherein step (f) comprises measuring a first electrical characteristic represented by a capacitance.

16. The method of claim 11 further comprising calculating an aggregate first electrical characteristic of said encapsulated electrophoretic display medium using measured first electrical characteristics of each of said at least one measurement pixel.

17. The method of claim 11 further comprising deducing a second electrical characteristic of said at least one measurement pixel based on said measured first electrical characteristic.

18. The method of claim 17, wherein said second electrical characteristic is resistivity of said at least one measurement pixel.

19. The method of claim 17 further comprising calculating an aggregate second electrical characteristic of said encapsulated electrophoretic display medium using deduced second electrical characteristics of each of said at least one measurement pixel.

20. The method of claim 17 further comprising measuring a first environmental factor of said encapsulated electrophoretic display medium using an external sensor.

21. The method of claim 20 further comprising determining a second environmental factor of said encapsulated electrophoretic display medium based on said resistivity and said measured first environmental factor.

22. The method of claim 21 wherein one of said first and second environmental factors is temperature, and the other is humidity.

23. A method for detecting a change in an electrical characteristic of an encapsulated electrophoretic display medium, comprising the steps of:
(a) providing an encapsulated electrophoretic display medium comprising a plurality of pixels, each pixel comprising at least one void dispersed in a polymeric matrix, wherein said at least one void contains an electrophoretic contrast medium phase that includes at least one particle and a suspending fluid;
(b) providing a first electrode, said first electrode being common to and adjacent each of said plurality of pixels;
(c) providing at least one measurement pixel of said plurality of pixels, said at least one measurement pixel having a measurement electrode adjacent thereto;
(d) applying a first electrical signal to said first electrode;
(e) applying a second electrical signal to said measurement electrode;
(f) measuring a first electrical characteristic of said at least one measuring pixel, thereby obtaining a first value of said electrical characteristic, said first electrical characteristic being generated in response to said applied first and second electrical signals;
(g) repeating steps (d)–(f), thereby obtaining a second value of said electrical characteristic; and
(h) comparing said first and second values of said electrical characteristic thereby detecting a change therein.

24. An apparatus for determining properties of an encapsulated electrophoretic display medium, said encapsulated electrophoretic display medium comprising a plurality of voids dispersed in a polymeric matrix, wherein at least one of said plurality of voids contains an electrophoretic contrast medium phase that includes at least one particle and a suspending fluid, and two electrodes adjacent to said plurality of voids; said apparatus comprising:
(a) a signal generator for applying electrical signals to said two electrodes; and
(b) a detection circuit for measuring a first electrical characteristic of said encapsulated electrophoretic display medium generated in response to said electrical signals.

25. The apparatus of claim 24, further comprising a processor for deducing a second electrical characteristic of said encapsulated electrophoretic display medium based on said measured first electrical characteristic.

26. The apparatus of claim 25 wherein said second electrical characteristic is resistivity of said encapsulated electrophoretic display medium.

27. The apparatus of claim 26 further comprising measuring a first environmental factor of said encapsulated electrophoretic display medium using an external sensor.

28. The apparatus of claim 27 further comprising determining a second environmental factor of said encapsulated electrophoretic display medium based on said resistivity and said measured first environmental factor.

29. The apparatus of claim 28 wherein one of said first and second environmental factors is temperature, and other is humidity.

30. The apparatus of claim 24 wherein said detection circuit comprises a capacitance bridge.

31. The apparatus of claim 24 wherein said detection circuit comprises a circuit capable of measuring time constants.

32. The apparatus of claim 24 wherein said detection circuit comprises a circuit capable of measuring frequency.

33. The apparatus of claim 24 wherein said detection circuit comprises a circuit capable of measuring voltage.

34. An electrophoretic display comprising an encapsulated electrophoretic display medium comprising a plurality of pixels, each pixel comprising at least one void dispersed in a polymeric matrix, wherein said at least one void contains an electrophoretic contrast medium phase that includes at least one particle and a suspending fluid, said electrophoretic display comprising:
  (a) a first electrode, said first electrode common to and adjacent each of said plurality of pixels;
  (b) at least one measurement pixel of said plurality of pixels, said at least one measurement pixel having a measurement electrode adjacent thereto;
  (c) a signal generator for applying electrical signals to said first electrode and said measurement electrode; and
  (d) a detection circuit for measuring a first electrical characteristic of said at least one measurement pixel, said first electrical characteristic generated in response to said applied electrical signals.

35. The electrophoretic display of claim 34 further comprising a processor for deducing a second electrical characteristic of said at least one measurement pixel based on said measured first electrical characteristic.

36. The electrophoretic display of claim 34 wherein said second electrical characteristic comprises resistivity of said at least one measurement pixel.

37. The electrophoretic display of claim 36 further comprising measuring a first environmental factor of said encapsulated electrophoretic display medium using an external sensor.

38. The electrophoretic display of claim 37 further comprising determining a second environmental factor of said encapsulated electrophoretic display medium based on said resistivity and said measured first environmental factor.

39. The electrophoretic display of claim 38 wherein one of said first and second environmental factors is temperature, and the other is humidity.

40. The electrophoretic display of claim 34 wherein said detection circuit comprises a capacitance bridge.

41. The electrophoretic display of claim 34 wherein said detection circuit comprises a circuit capable of measuring time constants.

42. The electrophoretic display of claim 34 wherein said detection circuit comprises a circuit capable of measuring frequency.

43. The electrophoretic display of claim 34 wherein said detection circuit comprises a circuit capable of measuring voltage.

44. An input device, comprising
  (a) an encapsulated electrophoretic display medium, said encapsulated electrophoretic display medium comprising a plurality of pixels, each pixel comprising at least one void dispersed in a polymeric matrix, wherein said at least one void contains an electrophoretic contrast medium phase that includes at least one particle and a suspending fluid, each pixel having a pixel electrode adjacent thereto;
  (b) a first electrode, said first electrode common to and adjacent each of said plurality of pixels;
  (c) a signal generator for applying electrical signals to said first electrode and each of said pixel electrodes;
  (d) a detection circuit for measuring a first electrical characteristic of each of said plurality of pixels, said first electrical characteristic generated in response to said applied electrical signals;
  (e) a discriminator circuit for detecting a change in said first electrical characteristic of at least one pixel of said plurality of pixels; and
  (f) a response generator for generating a response to said change and identifying said at least one pixel.

45. The input device of claim 44 wherein said first electrical characteristic is a voltage or capacitance.

46. The input device of claim 44, further comprising a processor for deducing a second electrical characteristic of said at least one pixel based on said measured first electrical characteristic.

47. The input device of claim 46 wherein said second electrical characteristic is resistivity.

* * * * *